(12) United States Patent
Hsu et al.

(10) Patent No.: US 12,114,579 B2
(45) Date of Patent: *Oct. 8, 2024

(54) METHOD OF FABRICATING RESISTIVE RANDOM ACCESS MEMORY CELL

(71) Applicant: Winbond Electronics Corp., Taichung (TW)

(72) Inventors: Po-Yen Hsu, Taichung (TW); Bo-Lun Wu, Taichung (TW); Tse-Mian Kuo, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/463,268

(22) Filed: Sep. 7, 2023

(65) Prior Publication Data

US 2023/0422638 A1 Dec. 28, 2023

Related U.S. Application Data

(62) Division of application No. 17/465,840, filed on Sep. 2, 2021, now Pat. No. 11,800,815.

(30) Foreign Application Priority Data

Apr. 28, 2021 (TW) .................................. 110115318

(51) Int. Cl.
G11C 11/00 (2006.01)
H10B 63/00 (2023.01)
H10N 70/00 (2023.01)

(52) U.S. Cl.
CPC ........... *H10N 70/021* (2023.02); *H10B 63/84* (2023.02); *H10N 70/063* (2023.02);
(Continued)

(58) Field of Classification Search
CPC ............... H10N 70/021; H10N 70/066; H10N 70/8833; H10N 70/841; H10N 70/063; H10N 70/068; H10B 63/84
(Continued)

(56) References Cited

U.S. PATENT DOCUMENTS 6,376,326 B1    4/2002  Lou
9,196,659 B2 *  11/2015 Park .................. H10N 70/24
(Continued)

FOREIGN PATENT DOCUMENTS

CN    104576926    4/2015
CN    106972038    7/2017
(Continued)

OTHER PUBLICATIONS

"Office Action of China Counterpart Application", issued on Apr. 9, 2024, p. 1-p. 7.

*Primary Examiner* — Viet Q Nguyen
(74) *Attorney, Agent, or Firm* — JCIPRNET

(57) ABSTRACT

A method of fabricating a resistive random access memory cell includes the following steps. A second sacrificial layer is formed around a patterned stacked layer. An opening passing through first conductive layers and first sacrificial layers of the patterned stacked layer is formed. A second conductive layer is formed in the opening, and the second conductive layer and the first conductive layers form a first electrode layer. The first sacrificial layers and the second sacrificial layer are removed. A variable resistance layer and an oxygen reservoir layer are formed. The oxygen reservoir layer is patterned to form a patterned oxygen reservoir layer and expose the variable resistance layer. A second dielectric layer is formed on the variable resistance layer and the patterned oxygen reservoir layer. A second electrode is formed in the second dielectric layer.

20 Claims, 7 Drawing Sheets

(52) U.S. Cl.
CPC ......... *H10N 70/066* (2023.02); *H10N 70/068* (2023.02); *H10N 70/841* (2023.02); *H10N 70/8833* (2023.02)

(58) Field of Classification Search
USPC ........................................................ 365/148
See application file for complete search history.

(56) References Cited

U.S. PATENT DOCUMENTS

| | | | | |
|---|---|---|---|---|
| 9,472,757 | B2* | 10/2016 | Xie | H01L 21/02175 |
| 10,014,469 | B2* | 7/2018 | Lee | H10N 70/821 |
| 10,163,651 | B1* | 12/2018 | Chen | H10N 70/063 |
| 10,230,047 | B2* | 3/2019 | Chen | H10N 70/801 |
| 10,340,450 | B2* | 7/2019 | Hsu | H10N 70/841 |
| 10,679,122 | B2* | 6/2020 | Park | G06N 3/049 |
| 11,107,983 | B2* | 8/2021 | Fu | H10N 70/24 |
| 11,239,417 | B1* | 2/2022 | Wu | H10N 70/821 |
| 11,758,830 | B2* | 9/2023 | Trinh | H10N 70/828 |
| | | | | 257/4 |
| 11,770,985 | B2* | 9/2023 | Hsu | H10N 70/8833 |
| | | | | 257/4 |
| 11,800,815 | B2* | 10/2023 | Hsu | H10N 70/821 |
| 2015/0171142 | A1 | 6/2015 | Kawashima et al. | |
| 2019/0334084 | A1* | 10/2019 | Ou Yang | H10N 70/24 |
| 2020/0343445 | A1 | 10/2020 | Strutt et al. | |
| 2022/0298851 | A1* | 9/2022 | Wakao | E06B 9/24 |
| 2022/0406846 | A1* | 12/2022 | Chiu | H10N 70/841 |
| 2023/0020564 | A1* | 1/2023 | Wang | H10B 63/80 |

FOREIGN PATENT DOCUMENTS

| | | |
|---|---|---|
| JP | WO2010067585 | 5/2012 |
| KR | 20200058133 | 5/2020 |
| TW | I602178 | 10/2017 |

\* cited by examiner

METHOD OF FABRICATING RESISTIVE RANDOM ACCESS MEMORY CELL

CROSS-REFERENCE TO RELATED APPLICATION

This application is a divisional application of and claims the priority benefit of a prior application Ser. No. 17/465,840, filed on Sep. 2, 2021. The prior application claims the priority benefit of Taiwan application serial no. 110115318, filed on Apr. 28, 2021. The entirety of the above-mentioned patent application is hereby incorporated by reference herein and made a part of this specification.

BACKGROUND

Technical Field

The disclosure relates to a memory and a method of fabricating the same, and more particularly, to a resistive random access memory cell and a method of fabricating the same.

Description of Related Art

RRAM has the advantages of fast operation speed and low power consumption, so it has become a kind of non-volatile memory that has been widely studied in recent years. When RRAM performs a SET operation, a positive voltage is applied to the resistive random access memory. Oxygen ions in the variable resistance layer enter the oxygen reservoir layer after being attracted by the positive voltage to leave the variable resistance layer, and the variable resistance layer will generate oxygen vacancies to form a conductive filament in a conductive state. At this time, the variable resistance layer is converted from a high resistance state (HRS) to a low resistance state (LRS). When the RRAM cell performs a RESET operation, a negative bias is applied to the resistive random access memory. The oxygen ions in the oxygen reservoir layer return to the variable resistance layer, such that the conductive filament is broken and is in a non-conductive state. At this time, the variable resistance layer is converted from LRS to HRS. However, if the oxygen vacancies generated in the variable resistance layer is insufficient, the amount of current in the low resistance state (LRS) will be insufficient. Although a thicker variable resistance layer and a higher operation voltage may drive more oxygen vacancies in the resistive random access memory, it will result in greater power consumption. If it is to avoid using an excessively high operation voltage, the contact area between the variable resistance layer and the first electrode layer must be increased to increase the amount of current, which will occupy too much chip area.

SUMMARY

The disclosure provides a resistive random access memory and a method of fabricating the same, so that the resistive random access memory has sufficient current and avoids using an excessively high operation voltage, so as to reduce power consumption.

The disclosure provides a resistive random access memory cell and a method of fabricating the same, which may reduce a chip area occupied by the resistive random access memory cell and improve an efficiency of oxygen exchange.

An embodiment of the disclosure provides a method of fabricating a resistive random access memory cell, which includes the following steps. A first electrode layer is formed on a dielectric layer and includes a body part extending in a first direction and multiple extension parts connected to a sidewall of the body part and extending in a second direction. A second direction is formed perpendicular to the first direction. An oxygen reservoir layer is formed covering the first electrode layer. A variable resistance layer is formed between the first electrode layer and the oxygen reservoir layer. A second electrode is formed above a top surface of the oxygen reservoir layer and around an upper sidewall of the oxygen reservoir layer.

An embodiment of the disclosure further provides a method of fabricating a resistive random access memory cell, which includes the following steps. A stacked layer alternately stacked by multiple first conductive layers and multiple first sacrificial layers is formed on a first dielectric layer. The stacked layer is patterned to form a patterned stacked layer. A second sacrificial layer is formed around the patterned stacked layer. An opening passing through the first conductive layers and the first sacrificial layers is formed in the patterned stacked layer. A second conductive layer is formed in the opening, and the second conductive layer and the first conductive layers form a first electrode layer. The first sacrificial layers and the second sacrificial layer are removed. A variable resistance layer and an oxygen reservoir layer are formed on a surface of the first electrode layer and a top surface of the first dielectric layer. The oxygen reservoir layer is patterned to form a patterned oxygen reservoir layer and expose the variable resistance layer. A second dielectric layer is formed on the variable resistance layer and the patterned oxygen reservoir layer. A second electrode is formed in the second dielectric layer, and the second electrode covers a top surface and an upper sidewall of the patterned oxygen reservoir layer.

Based on the above, the disclosure provides the resistive random access memory and the method of fabricating the same, which may enable the resistive random access memory to have sufficient current and avoid using the excessively high operation voltage, so as to reduce the power consumption. In addition, the chip area occupied by the resistive random access memory cell may further be reduced. Furthermore, the efficiency of oxygen exchange may also be improved.

DETAILED DESCRIPTION OF DISCLOSED EMBODIMENTS

Figure 1A:
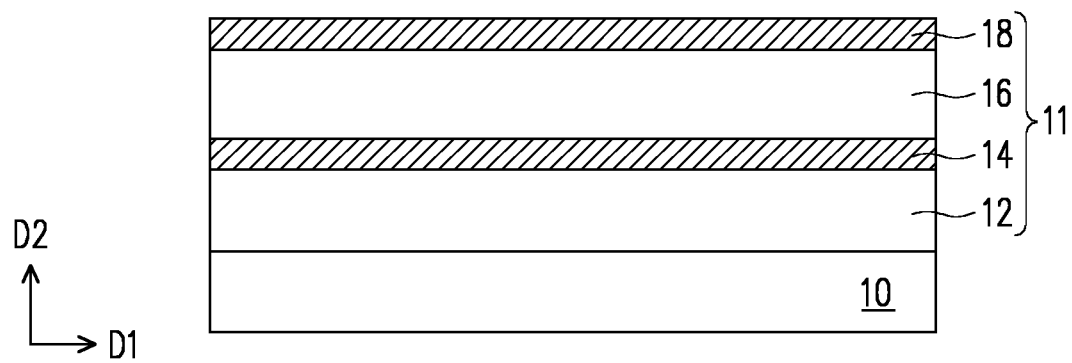
FIGS. 1A to 1M are schematic cross-sectional views of fabricating a resistive random access memory according to an embodiment of the disclosure.
Figure 1B:
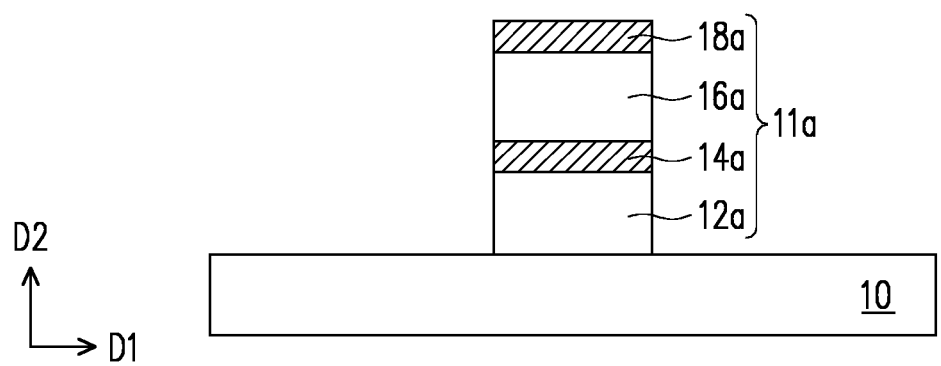
Figure 1C:
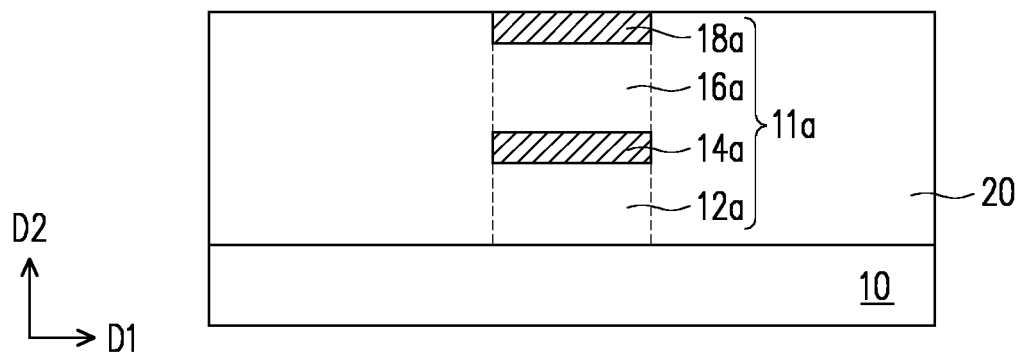
Figure 1D:
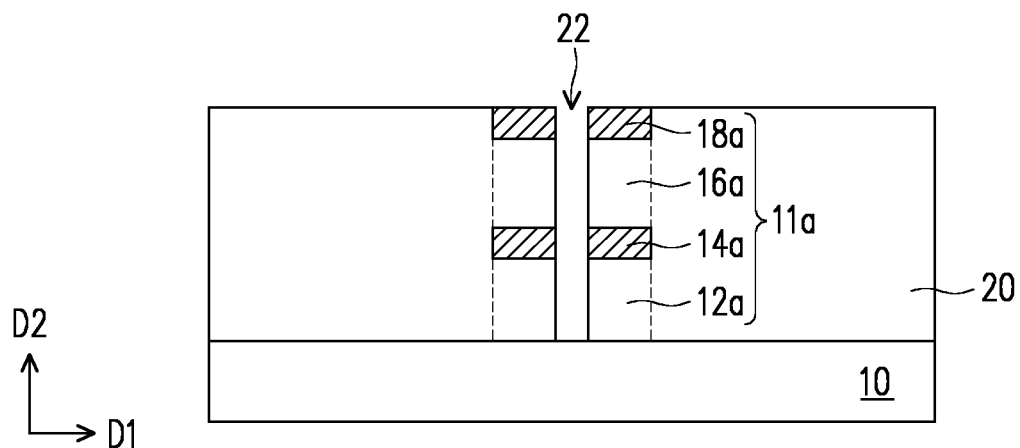
Figure 1E:
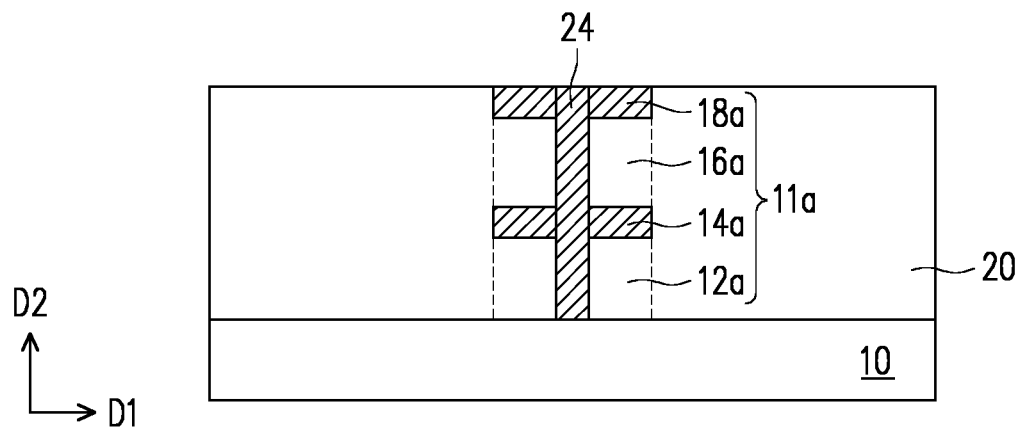
Figure 1F:
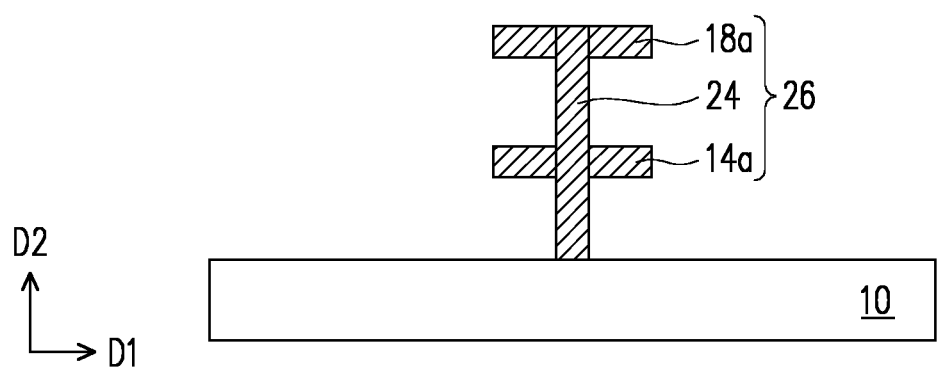
Figure 1G:
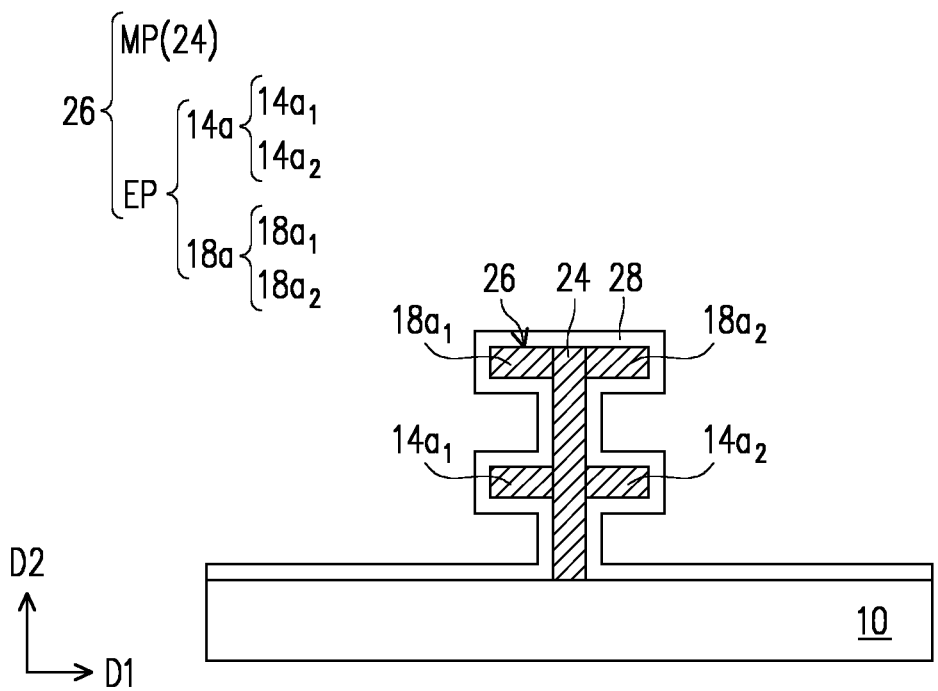
Figure 1H:
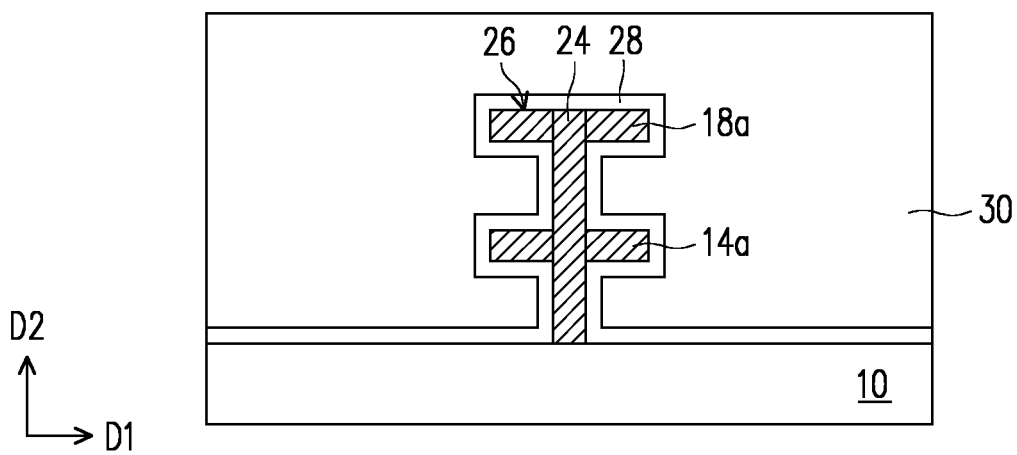
Figure 1I:
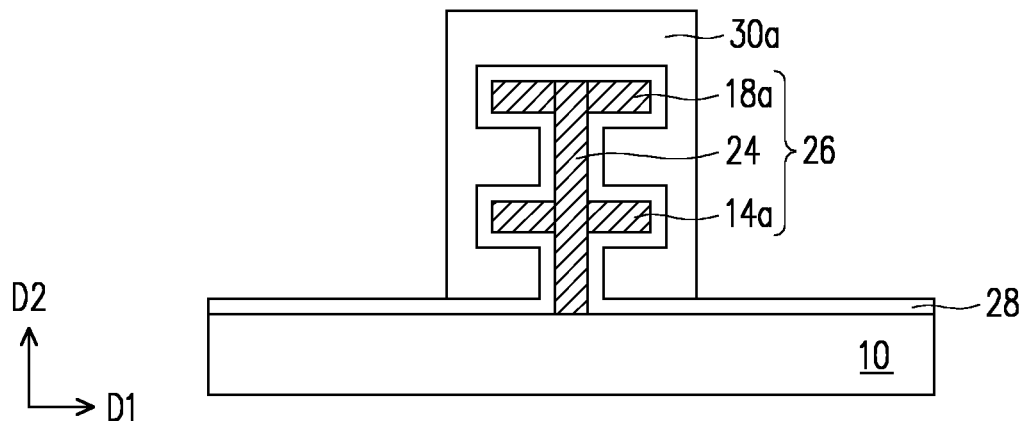
Figure 1J:
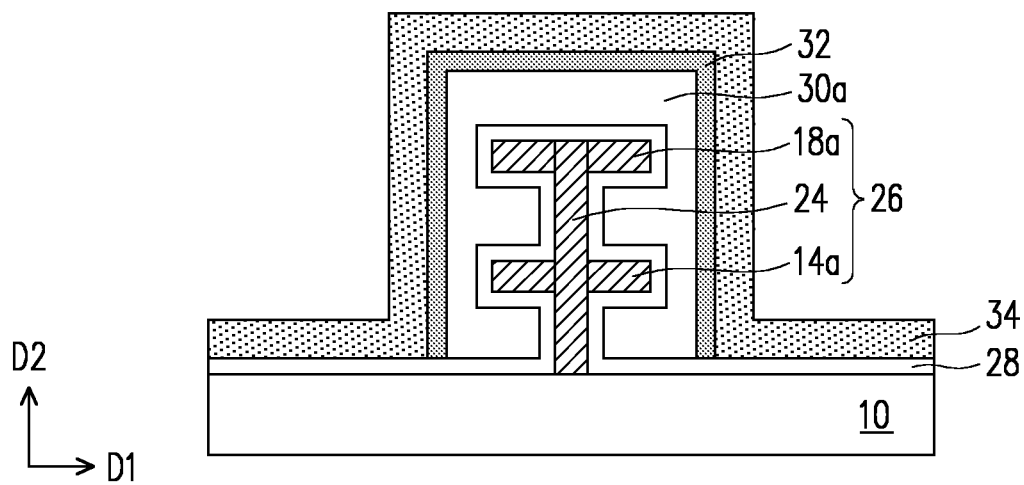
Figure 1K:
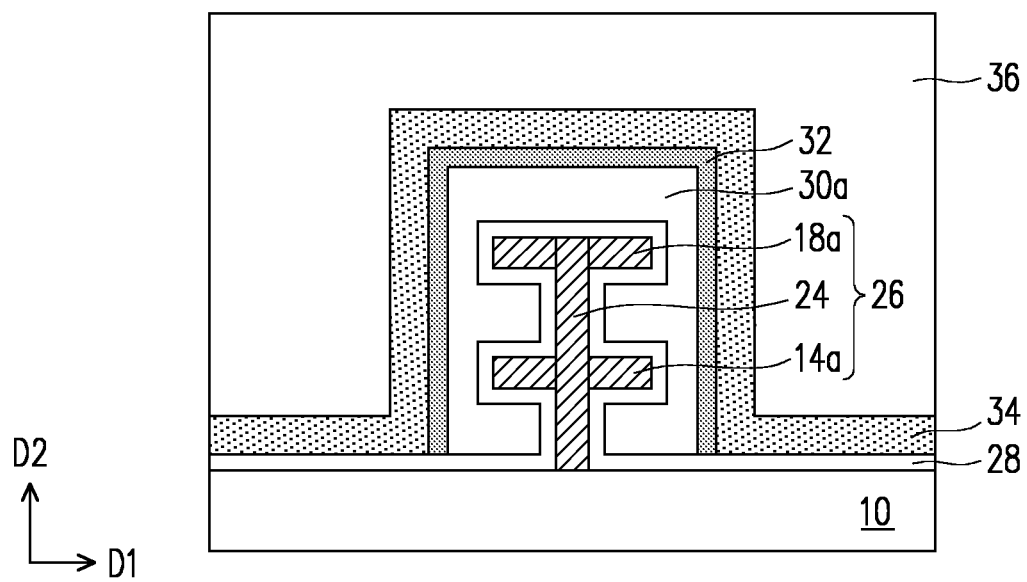
Figure 1L:
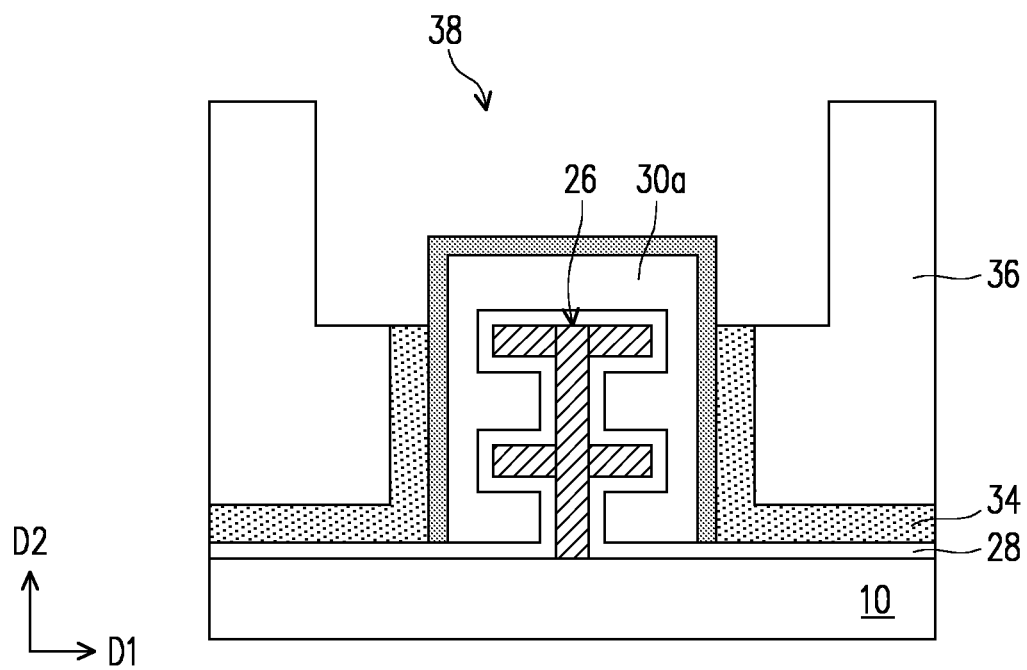
Figure 1M:
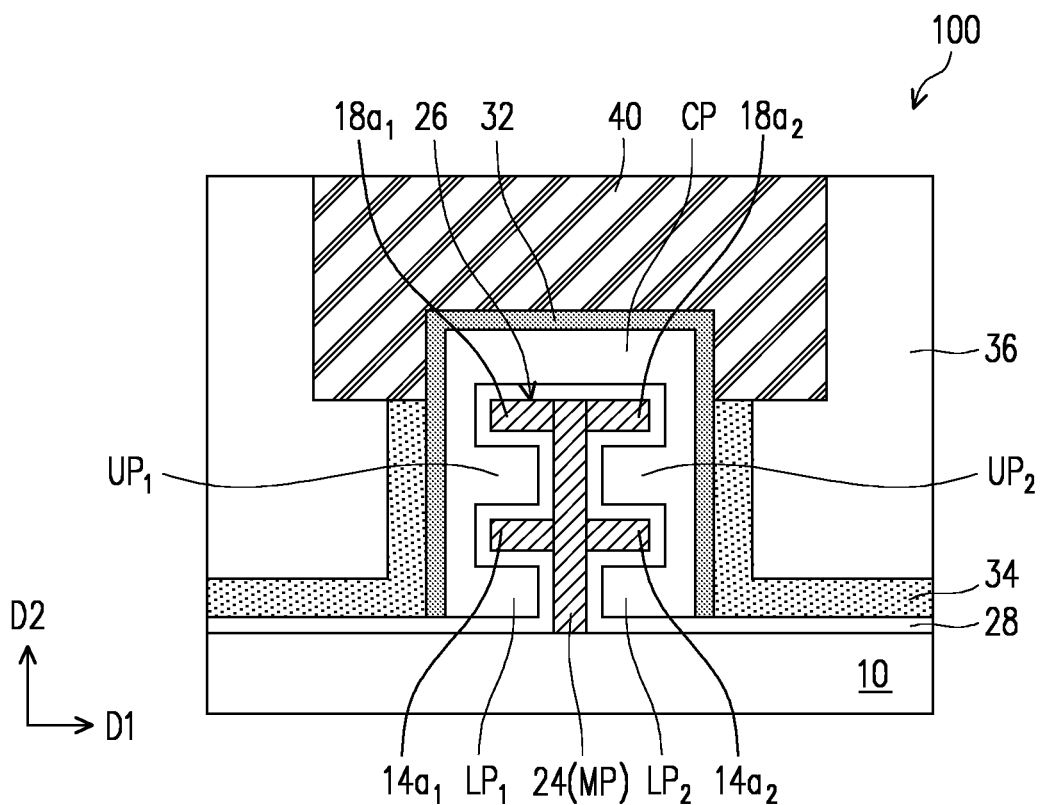

Referring to FIG. 1M, a resistive random access memory cell 100 includes a first electrode layer 26, a variable resistance layer 28, an oxygen reservoir layer (ORL) 30a, a diffusion barrier layer 32, a second electrode 40, and an etch stop layer 34.

The RRAM cell 100 is located on a dielectric layer 10. The dielectric layer 10 may be an inner dielectric layer or an interlayer dielectric layer above a substrate. A conductive feature may be a conductive wire or a via. The substrate may be a semiconductor substrate or a semiconductor-on-insulator (SOI) substrate. Other elements may be included between the substrate and the conductive feature, such as a transistor.

The first electrode layer 26 is a stacked structure SK. The first electrode layer 26 includes a body part MP and multiple extension parts EP. The body part MP extends in a direction D2, and the direction D2 is perpendicular to a surface of the dielectric layer 10. A bottom surface of the body part MP may be electrically connected to the conductive feature (not shown) in the dielectric layer 10. The extension parts EP extend in a direction D1, and the direction D1 is parallel to the surface of the dielectric layer 10. In some embodiments, the extension parts EP include a lower extension part 14a and an upper extension part 18a stacked above the lower extension part 14a at intervals. The lower extension part 14a includes a first extension part $14a_1$ and a second extension part $14a_2$, which are correspondingly disposed on a lower sidewall of the body part MP and connected to sidewalls of the body part MP. The upper extension part 18a is located above the lower extension part 14a, which includes a third extension part $18a_1$ and a fourth extension part $18a_2$ correspondingly disposed on an upper sidewall of the body part MP and connected to the sidewalls of the body part MP. The third extension part $18a_1$ and the fourth extension part $18a_2$ are respectively stacked above the first extension part $14a_1$ and the second extension part 14a2 at intervals. Top surfaces of the third extension part $18a_1$ and the fourth extension part $18a_2$ may be coplanar with a top surface of the body part MP.

The variable resistance layer 28 covers a surface of the first electrode layer 26 and the surface of the dielectric layer 10. The variable resistance layer 28 is, for example, a conformal layer, and covers the top surface and the sidewalls of the body part MP of the first electrode layer 26, and top surfaces, sidewalls, and bottom surfaces of the extension parts 14a and 18a. The variable resistance layer 28 is further located on a bottom surface of the oxygen reservoir layer and a bottom surface of the diffusion barrier layer 32, and between a bottom surface of the etch stop layer 34 and a top surface of the dielectric layer 10.

The oxygen reservoir layer 30a is located on the dielectric layer 10, and covers the variable resistance layer 28. The oxygen reservoir layer 30a may include a cap part CP and multiple protruding parts PP. The cap part CP is substantially inverted U-shaped. The protruding parts PP protrude from an inner wall of the cap part CP toward the body part MP of the first electrode layer 26. The protruding parts PP include a lower protruding part LP and an upper protruding part UP. The lower protruding part LP includes a first protruding part $LP_1$ and a second protruding part $LP_2$ opposite to each other. The first protruding part $LP_1$ is located in a space enclosed by the first extension part $14a_1$ of the first electrode layer 26, the body part MP, and the dielectric layer 10. The second protruding part $LP_2$ is located in a space enclosed by the second extension part $14a_2$ of the first electrode layer 26, the body part MP, and the dielectric layer 10. A third protruding part $UP_1$ is located in a space enclosed by the first extension part $14a_1$ of the first electrode layer 26, the body part MP, and the third extension part $18a_1$. A fourth protruding part $UP_2$ is located in a space enclosed by the second extension part $14a_2$ of the first electrode layer 26, the body part MP, and the fourth extension part $18a_2$.

The diffusion barrier layer 32 covers a top surface and an outer sidewall of the cap part CP of the oxygen reservoir layer 30a. The diffusion barrier layer 32 is, for example, a conformal layer. A cross-section of the diffusion barrier layer 32 is inverted U-shaped.

The etch stop layer 34 covers a lower sidewall of the diffusion barrier layer 32 and a top surface of the variable resistance layer 28 on the dielectric layer 10. A cross-section of the etch stop layer 34 is L-shaped.

The second electrode 40 is located above a top surface of the oxygen reservoir layer 30a, on the diffusion barrier layer 32 around an upper sidewall of the oxygen reservoir layer 30a, and on a top surface of the etch stop layer 34.

When a positive voltage is applied to the second electrode 40 of the RRAM cell 100, oxygen ions are attracted by the positive voltage to leave the variable resistance layer 28 and are stored in the oxygen reservoir layer 30a, and oxygen vacancies are generated in the variable resistance layer 28 to form a conductive filament, and the conductive filament is in a conductive state. At this time, the variable resistance layer 28 is converted from a high resistance state (HRS) to a low resistance state (LRS). Such operation is usually called setting (hereinafter referred to as SET). When a negative bias is applied to the second electrode 40 of the RRAM cell 100, the oxygen ions in the oxygen reservoir layer 30a enter the variable resistance layer 28 and are combined with the conductive filament, such that the conductive filament is broken and is in a non-conductive state. At this time, the variable resistance layer 28 is converted from LRS to HRS. Such operation is usually called resetting (hereinafter referred to as RESET).

Materials of the first electrode layer 26 and the second electrode 40 may include metal, metal nitride, other materials, or a combination thereof, such as titanium nitride (TiN), tantalum nitride (TaN), titanium aluminum nitride (TiAlN), titanium tungsten (TiW) alloy, platinum (Pt), iridium (Ir), ruthenium (Ru), titanium (Ti), tungsten (W), tantalum (Ta), aluminum (Al), zirconium (Zr), hafnium (Hf), nickel (Ni), copper (Cu), cobalt (Co), iron (Fe), gadolinium (Gd), manganese (Mn), graphite, or a combination of the above materials. The first electrode layer 26 and the second electrode 40 may be a single layer or multiple layers.

A material of the variable resistance layer 28 includes metal oxide, such as hafnium oxide ($HfO_2$), tantalum oxide ($Ta_2O_5$), titanium oxide ($TiO_2$), magnesium oxide (MgO), nickel oxide (NiO), niobium oxide ($Nb_2O_5$), aluminium oxide ($Al_2O_3$), vanadium oxide ($V_2O_5$), tungsten oxide ($WO_3$), zinc oxide (ZnO), or cobalt oxide (CoO). In this embodiment, an oxygen content of the variable resistance layer 28 may be about 75 atomic percent (at %) to about 100 atomic percent. A thickness of the variable resistance layer 28 is, for example, 2 nanometers to 10 nanometers.

A material of the oxygen reservoir layer 30a may include metal, such as titanium, tantalum, hafnium, or aluminum.

The diffusion barrier layer 32 may block the oxygen ions in the variable resistance layer 28 from diffusing to the second electrode 40 when the RRAM cell 100 performs a RESET operation. The diffusion barrier layer 32 may include a dielectric material layer with high dielectric constant that has a dielectric constant greater than 4, such as aluminum oxide, hafnium oxide, zirconium oxide, or a combination thereof.

When the RRAM cell performs a forming operation, the positive voltage is applied to the second electrode 40, such that the oxygen ions in the variable resistance layer 28 enter the oxygen reservoir layer 30a after being attracted by the positive voltage to leave the variable resistance layer 28, and the oxygen vacancies are generated in the variable resistance layer 28 to form a conductive filament current. Since the variable resistance layer 28 is not too thick, a forming voltage may be reduced to be applied to a low-power element.

A method of fabricating the RRAM cell may be described as follows with reference to FIGS. 1A to 1M.

Referring to FIG. 1A, a stacked layer 11 is formed on the substrate (not shown) on which the dielectric layer 10 has been formed. The stacked layer 11 includes a sacrificial layer 12, a conductive layer 14, a sacrificial layer 16, and a conductive layer 18. Materials of the sacrificial layers 12 and 16 are, for example, silicon oxide. Materials of the conductive layers 14 and 18 are, for example, the above materials suitable for forming the first electrode layer 26.

Referring to FIG. 1B, a photolithography and etching process is performed to pattern the stacked layer 11, so as to form a patterned stacked layer 11a. The patterned stacked layer 11a includes a conductive layer 18a, a sacrificial layer 16a, a conductive layer 14a, and a sacrificial layer 12a.

Referring to FIG. 1C, a sacrificial layer 20 is formed around the patterned stacked layer 11a. A material of the sacrificial layer 20 may be the same as or similar to the materials of the sacrificial layers 12 and 16, such as silicon oxide. The sacrificial layer 20 may be deposited by a chemical vapor deposition method, and then planarized by a planarization process, such as an etching back or a chemical mechanical polishing process. The sacrificial layer 20 may also be formed by spin coating.

Referring to FIG. 1D, the photolithography and etching process is performed to form an opening 22. The opening 22 passes through the conductive layer 18a, the sacrificial layer 16a, the conductive layer 14a, and the sacrificial layer 12a, and exposes the conductive feature in the dielectric layer 10.

Referring to FIG. 1E, a conductive layer 24 is backfilled in the opening 22. A material of the conductive layer 24 is, for example, the above material suitable for forming the first electrode layer 26. A method of forming the conductive layer 24 is, for example, depositing a conductive material layer on the sacrificial layer 20 and in the opening 22, and then planarizing the conductive material layer by the chemical mechanical polishing process, so as to remove an excess portion on the sacrificial layer 20.

Referring to FIG. 1F, the sacrificial layers 20, 16a, and 12a are removed. The exposed conductive layers 24, 18a, and 14a form the first electrode layer 26. The first electrode layer 26 is the stacked structure SK. The conductive layer 24 may be used as the body part MP of the stacked structure SK. The conductive layers 18a and 14a may be used as the extension parts EP of the stacked structure SK. The conductive layer 18a may also be called the upper extension part 18a. The conductive layer 14a may also be called the lower extension part 14a. The lower extension part 14a includes the first extension part $14a_1$ and the second extension part $14a_2$. The upper extension part 18a includes the third extension part $18a_1$ and the fourth extension part $18a_2$.

Referring to FIGS. 1G and 1H, the variable resistance layer 28 and an oxygen reservoir layer 30 are sequentially formed on the first electrode layer 26 and the dielectric layer 10. The oxygen reservoir layer 30 is further filled in a space between the body part MP of the upper extension part 18a and the dielectric layer 10, and is filled in a space between the lower extension part 14a, the body part MP, and the upper extension part 18a.

Referring to FIG. 1I, the photolithography and etching process is performed to pattern the oxygen reservoir layer 30, so as to form the oxygen reservoir layer 30a. The oxygen reservoir layer 30a covers the variable resistance layer 28 on the first electrode layer 26 and a portion of the variable resistance layer 28 on the dielectric layer 10, and exposes another portion of the variable resistance layer 28 on the dielectric layer 10.

Referring to FIG. 1J, the diffusion barrier layer 32 is formed on the oxygen reservoir layer 30a and the variable resistance layer 28. The diffusion barrier layer 32 covers the top surface and sidewalls of the oxygen reservoir layer 30a. Next, the etch stop layer 34 is formed on the diffusion barrier layer 32 and the variable resistance layer 28.

Referring to FIG. 1K, a dielectric layer 36 is formed on the etch stop layer 34. A material of the dielectric layers 36 is, for example, silicon oxide.

Referring to FIG. 1L, the photolithography and etching process is performed to remove a portion of the dielectric layer 36 and a portion of the etch stop layer 34, so as to form an opening 38. In the process of etching, the etch stop layer 34 is used as a stop layer first. After the top surface of the etch stop layer 34 is exposed, a portion of the etch stop layer 34 is etched and removed by controlling the time until a top surface of the diffusion barrier layer 32 is exposed.

Referring to FIG. 1M, the conductive layer is filled in the opening 38. A material of the conductive layer includes the material suitable for forming the second electrode 40. For example, the conductive material layer is formed on the dielectric layer 36 and in the opening 38, and then planarized by the planarization process, such as the etching back or the chemical mechanical polishing process.

The first electrode layer 26 is a vertical stacked structure SK. Therefore, a chip area occupied by the resistive random access memory may be saved.

The variable resistance layer 28 surrounds the first electrode layer 26 having the vertical stacked structure. Since the first electrode layer 26 has an extremely high surface area, the thin variable resistance layer 28 may form sufficient oxygen vacancies, thereby increasing a current of the resistive random access memory. Therefore, it is not necessary to increase the thickness of the variable resistance layer 28 in order to increase the oxygen vacancies, so it is possible to avoid using an excessively high operation voltage to reduce power consumption.

Since the variable resistance layer 28 underneath is not etched when the oxygen reservoir layer 30 is patterned, the variable resistance layer 28 protrudes from the sidewalls of the oxygen reservoir layer 30a, and an end of the variable resistance layer 28 is far away from the oxygen reservoir layer 30a. Therefore, it is possible to prevent the end of the variable resistance layer 28 from forming an electrical leakage path.

Since the oxygen storage layer 30a wraps around the variable resistance layer 28 and the first electrode layer 26, an efficiency of oxygen exchange may be improved.

What is claimed is:

1. A method of fabricating a resistive random access memory cell, comprising:
    forming a stacked layer alternately stacked by a plurality of first conductive layers and a plurality of first sacrificial layers on a first dielectric layer;
    patterning the stacked layer to form a patterned stacked layer;
    forming a second sacrificial layer around the patterned stacked layer;
    forming an opening passing through the plurality of first conductive layers and the plurality of first sacrificial layers in the patterned stacked layer;
    forming a second conductive layer in the opening, wherein the second conductive layer and the plurality of first conductive layers form a first electrode layer;
    removing the plurality of first sacrificial layers and the second sacrificial layer;

forming a variable resistance layer and an oxygen reservoir layer on a surface of the first electrode layer and a top surface of the first dielectric layer;

patterning the oxygen reservoir layer to form a patterned oxygen reservoir layer and expose the variable resistance layer;

forming a second dielectric layer on the variable resistance layer and the patterned oxygen reservoir layer; and forming a second electrode in the second dielectric layer, wherein the second electrode covers a top surface and an upper sidewall of the patterned oxygen reservoir layer.

2. The method of fabricating the resistive random access memory cell according to claim 1, wherein forming the second conductive layer in the opening comprises:

depositing a conductive material layer on the second sacrificial layer and in the opening; and planarizing the conductive material layer to remove an excess portion on the second sacrificial layer.

3. The method of fabricating the resistive random access memory cell according to claim 1, wherein the first electrode layer comprises:

a body part extending in a first direction; and a plurality of extension parts connected to a sidewall of the body part and extending in a second direction, wherein the second direction is perpendicular to the first direction.

4. The method of fabricating the resistive random access memory cell according to claim 3, wherein the oxygen reservoir layer comprises:

a cap part covering the first electrode layer; and a plurality of protruding parts extending from an inner wall of the cap part toward the sidewall of the body part.

5. The method of fabricating the resistive random access memory cell according to claim 1, further comprising:

before forming the second dielectric layer, forming a diffusion barrier layer on the top surface and a sidewall of the patterned oxygen reservoir layer, and the variable resistance layer.

6. The method of fabricating the resistive random access memory cell according to claim 5, further comprising:

before forming the second dielectric layer, forming an etch stop layer on the diffusion barrier layer and the variable resistance layer.

7. The method of fabricating the resistive random access memory cell according to claim 6 wherein forming the second electrode in the second dielectric layer comprises:

with the etch stop layer as a stop layer, patterning the second dielectric layer;

removing a portion of the etch stop layer until a top surface of the diffusion barrier layer is exposed so as to form the opening; and forming a conductive material layer in the opening.

8. A method of fabricating a resistive random access memory cell, comprising:

forming a first electrode layer located on a first dielectric layer, wherein the first electrode layer comprises:

a body part extending in a first direction; and a plurality of extension parts connected to a sidewall of the body part and extending in a second direction, wherein the second direction is perpendicular to the first direction;

forming an oxygen reservoir layer covering the first electrode layer;

forming a variable resistance layer located between the first electrode layer and the oxygen reservoir layer; and forming a second electrode located above a top surface of the oxygen reservoir layer and around an upper sidewall of the oxygen reservoir layer.

9. The method according to claim 8, wherein the plurality of extension parts comprises:

a plurality of lower extension parts located on a lower sidewall of the body part; and a plurality of upper extension parts located above the plurality of lower extension parts and on an upper sidewall of the body part.

10. The method according to claim 8, wherein the oxygen reservoir layer comprises:

a cap part covering the first electrode layer; and a plurality of protruding parts extending from an inner wall of the cap part toward the sidewall of the body part.

11. The method according to claim 10, wherein the material of the oxygen reservoir layer comprises titanium, tantalum, hafnium, or aluminum.

12. The method according to claim 10, wherein cross-section of the cap part is substantially inverted U-shaped.

13. The method according to claim 10, further comprising forming a diffusion barrier layer covering a top surface and an outer sidewall of the cap part of the oxygen reservoir layer.

14. The method according to claim 13, wherein the material of the diffusion barrier layer comprises aluminum oxide, hafnium oxide, zirconium oxide, or a combination thereof.

15. The method according to claim 13, wherein a cross-section of the diffusion barrier layer is inverted U-shaped.

16. The method according to claim 13, further comprising forming an etch stop layer on a lower sidewall of the diffusion barrier layer and above the first dielectric layer.

17. The method according to claim 16, wherein a cross-section of the etch stop layer is L-shaped.

18. The method according to claim 16, wherein a bottom of the second electrode contacts a top surface of the etch stop layer, the diffusion barrier layer around an upper sidewall of the oxygen reservoir layer.

19. The method according to claim 16, wherein the variable resistance layer is further formed on a bottom surface of the oxygen reservoir layer and a bottom surface of the diffusion barrier layer, and between a bottom surface of the etch stop layer and a top surface of the first dielectric layer.

20. The method according to claim 16, further comprising forming a second dielectric layer disposed on the etch stop layer, wherein the second electrode is embedded in the second dielectric layer.

* * * * *